United States Patent
Pasternak

(10) Patent No.: US 9,476,919 B2
(45) Date of Patent: Oct. 25, 2016

(54) LOW PROFILE CURRENT MEASUREMENT CONNECTOR AND USE

(71) Applicant: NATIONAL INSTRUMENTS CORPORATION, Austin, TX (US)

(72) Inventor: David R. Pasternak, Austin, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 0 days.

(21) Appl. No.: 14/856,368

(22) Filed: Sep. 16, 2015

(65) Prior Publication Data
US 2016/0003872 A1    Jan. 7, 2016

Related U.S. Application Data

(63) Continuation of application No. 14/179,300, filed on Feb. 12, 2014, now Pat. No. 9,250,272.

(51) Int. Cl.
| | |
|---|---|
| *G01R 15/18* | (2006.01) |
| *G01R 1/44* | (2006.01) |
| *G01R 19/00* | (2006.01) |
| *H01R 13/504* | (2006.01) |
| *H01R 13/66* | (2006.01) |
| *H01R 43/24* | (2006.01) |
| *G01R 1/04* | (2006.01) |
(Continued)

(52) U.S. Cl.
CPC ......... *G01R 19/0092* (2013.01); *G01R 1/0416* (2013.01); *G01R 1/36* (2013.01); *G01R 1/44* (2013.01); *G01R 3/00* (2013.01); *G01R 15/18* (2013.01); *H01R 13/504* (2013.01); *H01R 13/6633* (2013.01); *H01R 43/24* (2013.01); *H01R 2201/20* (2013.01); *Y10T 29/49208* (2015.01)

(58) Field of Classification Search
CPC .... G01R 19/0092; G01R 19/32; G01R 1/44; G01R 15/18; G01R 19/16585; H01R 2201/00
USPC ........... 324/105, 754.26, 755.01, 76.75, 127, 324/156
See application file for complete search history.

(56) References Cited

U.S. PATENT DOCUMENTS

| | | | |
|---|---|---|---|
| 4,093,968 A * | 6/1978 | Shirey | H01C 1/084 338/283 |
| 5,329,440 A | 7/1994 | Chaussy | |
| 5,338,332 A | 8/1994 | Baran | |

(Continued)

*Primary Examiner* — Melissa Koval
*Assistant Examiner* — Rahul Maini
(74) *Attorney, Agent, or Firm* — Meyertons Hood Kivlin Kowert & Goetzel, P.C.; Jeffrey C. Hood; Mark S. Williams

(57) ABSTRACT

A current measurement connector may include a first part and a second part. Each part may include a mount and a joint. The first and second part may be joined via the respective joints through a current transformer interposed between the first and second parts. The respective mounts may be configured to receive a current from a current source and pass the received current through the current transformer via the first and second parts inducing a current in the current transformer. The induced current may be useable to measure the current from the current source. Methods for fabricating the current measurement connector may include die casting the first and second parts and press fitting the first and second parts at the respective joints through the current transformer. Methods for use may include withstanding a fault current pulse and dissipating heat associated with the pulse via the first and second parts.

23 Claims, 8 Drawing Sheets

(51) Int. Cl.
    *G01R 1/36*     (2006.01)
    *G01R 3/00*     (2006.01)

(56) References Cited

U.S. PATENT DOCUMENTS

| | | | |
|---|---|---|---|
| 5,386,188 A | 1/1995 | Minneman | |
| 5,552,700 A * | 9/1996 | Tanabe | G01R 19/0092 324/117 H |
| 6,528,960 B1 * | 3/2003 | Roden | G01R 19/0092 318/400.32 |
| 7,688,040 B2 | 3/2010 | Basic | |
| 7,719,258 B2 | 5/2010 | Chen | |
| 8,238,066 B2 * | 8/2012 | Zylstra | G01R 15/183 361/42 |
| 8,487,606 B2 * | 7/2013 | Juds | G01R 15/142 324/126 |
| 8,829,888 B2 * | 9/2014 | Chamarti | G01R 15/181 324/76.11 |
| 2008/0077336 A1 * | 3/2008 | Fernandes | G01R 15/142 702/57 |
| 2012/0313619 A1 | 12/2012 | Hurwitz | |
| 2014/0015516 A1 | 1/2014 | Sorensen | |
| 2014/0210454 A1 | 7/2014 | Tedd | |

* cited by examiner

*Current Pulse Profile*

*Temperature Response*

LOW PROFILE CURRENT MEASUREMENT CONNECTOR AND USE

This application is a continuation of U.S. application Ser. No. 14/179,300, titled "Low Profile Current Measurement Connector", filed Feb. 12, 2014, whose inventor was David R. Pasternak.

FIELD OF THE INVENTION

The present invention relates to the field of current measurement, and more particularly to a low profile current measurement connector.

DESCRIPTION OF THE RELATED ART

Current measurement devices must be able to withstand fault current, or over-current, events in order to ensure the safety of the user and the power grid during such events. Note that the primary safety concerns are the excessive temperature rises caused by such events and the isolation of the PMU from such events. Therefore, the power measurement industry has specified that current inputs to power measurement units (PMUs) must be able to withstand current pulses of up to two hundred and fifty times the nominal current transformer (CT) value for one cycle, e.g., a complete period within an alternating current (AC) waveform. In most cases, the nominal CT value is either 1 ampere (A) or 5 A. Thus, for a 5 A nominal CT value, the current inputs of the PMU must withstand a maximum current pulse of 1250 A for one cycle. Thus, in countries using a 50 hertz (Hz) AC waveform, the PMU must withstand a maximum current pulse of 1250 A for 0.02 seconds.

Prior art solutions were able to withstand these maximum current pulses only with form factors greater than four square inches of total printed circuit board (PCB) space. These large form factors of the prior art solutions were caused by the need to maintain a low resistance through the primary windings of a CT. This need to maintain a low resistance caused the primary windings to grow in size, i.e., cross sectional area through the CT needed to grow in size, to inhibit excessive temperature rise in the device.

Furthermore, prior art solutions were only able to withstand excessive temperatures by maintaining enough distance from the primary windings to any thermally sensitive components, further growing the overall size of the current measurement circuit. Thus, there is a need for smaller form factors for current measurement devices.

SUMMARY OF THE INVENTION

Various embodiments of a low profile current measurement connector and methods for manufacturing and using a low profile current measurement connector are presented below. In one embodiment, a current measurement connector may include a first part and a second part. The first part may include a first mount and a first joint. In certain embodiments, the first part may also include one or more pins or tabs configured to couple the first part to a printed circuit board. In such embodiments, the coupling between the first part and the printed circuit board may be mechanical only. Thus, the first part may be electrically isolated from the printed circuit board. The second part may include a second mount and a second joint. In one embodiment, the first part and the second part may be die cast from one or more of zinc, aluminum, or copper.

Additionally, the current measurement connector may include a current transformer. The current transformer may be interposed between the first part and the second part and the first part and the second part may connect at the first and second joints through the current transformer, thereby electrically coupling the first mount to the second mount. In an exemplary embodiment, the first and second joints may implement at least a portion of a primary coil. In certain embodiments, the first mount and the second mount may be configured to receive a first current from a current source and the current measurement connector may be configured to pass the first current from the current source through the first and second joints thereby inducing a second current in the current transformer. The second current may be useable to measure the first current. In certain embodiments, the first mount may be further configured to electrically couple to a first wire lug via a first threaded fastener and the second mount may be further configured to electrically couple to a second wire lug via a second threaded fastener and the first and second wire lug may be electrically coupled to the current source.

In certain embodiments, the first and second joints may be first and second cold-forming joints. Accordingly, the first part and the second part may connect at the first and second cold-forming joints via a press fit.

In an exemplary embodiment, the current measurement connector may also include an overmold. The overmold may encapsulate the first and second parts connected through the current transformer and may electrically isolate the current measurement connector. Additionally, the overmold may thermally insulate the current measurement connector and may mechanically isolate the current measurement connector from mechanical vibration.

In another embodiment, the current measurement connector may also include a spacer interposed between the first mount and the second mount. In such embodiments, the spacer may be configured to isolate the first mount and second mount from mechanical vibration and prevent an alternative electrical coupling between the first mount and second mount.

In certain embodiments, the current measurement connector may be able to withstand fault current pulses, thereby protecting the current transformer from damage. In other embodiments, the current measurement connector is able to dissipate heat associated with fault current pulses, thereby protecting the current transformer from damage. In one embodiment, the fault current pulse may be at least approximately one thousand two hundred and fifty amperes for at least approximately one cycle.

In an exemplary embodiment a method for manufacturing, or fabricating, a current measurement connector may include casting a first part and a second part. The first part may include a first mount and a first joint. In certain embodiments, the first part may also include one or more tabs or pins for mounting the first part to a printed circuit board. In certain embodiments, the one or more pins may be soldering pins configured to mount to the printed circuit board via a wave soldering process. The second part may include a second mount and a second joint. Additionally, the first part and the second part may be joined via the first and second joints through a current transformer interposed between the first part and the second part, thereby electrically coupling the first mount to the second mount, wherein the first mount and the second mount are configured to receive a first current from a current source. Accordingly, the current measurement connector may be configured to pass the first current through the first and second joints thereby inducing a second current in the current transformer, wherein the second current is useable to measure the first current.

In an exemplary embodiment, the first joint may be a first cold-forming joint and the second joint may be a second cold-forming joint, and joining the first and second parts may also include press fitting the first part and the second part via the first and second cold-forming joints.

Additionally, the method may include applying, after joining the first and second parts, an overmold. The overmold may encapsulate the first and second parts connected through the current transformer, electrically isolate the current measurement connector, thermally insulate the current measurement connector, and mechanically isolate the current measurement connector from mechanical vibration.

In one embodiment, joining the first and second parts may also include interposing a spacer between the first mount and the second mount. The spacer may be configured to isolate the first mount and second mount from mechanical vibration and prevent an alternative electrical coupling between the first mount and second mount.

In another embodiment, the method may also include plating the first and second parts with tin, where the tin prevents galvanic corrosion of the first and second mounts. Additionally, in one embodiment, the first part and the second part may be die cast from one or more of zinc, aluminum, or copper.

In an exemplary embodiment for a method for measuring current, the method may include connecting a current source to a current measurement connector via a first and second mount of the current measurement connector. The current measurement connector may include a first part and a second part and the first part and the second part may connect at respective cold-forming joints through a current transformer that may be interposed between the first and second parts. Additionally, a first current from the current source may be passed, via the current measurement connector, through the respective cold-forming joints thereby inducing a second current in the current transformer. The second current is useable to measure the first current. Further, the method may include applying a fault current pulse and the fault current pulse may be at least approximately one thousand two hundred and fifty amperes for at least approximately one cycle. Additionally, heat associated with applying the fault current pulse may be dissipated via the first and second parts thereby protecting the current transformer.

BRIEF DESCRIPTION OF THE DRAWINGS

A better understanding of the present invention can be obtained when the following detailed description of the preferred embodiment is considered in conjunction with the following drawings, in which.

Figure 1:
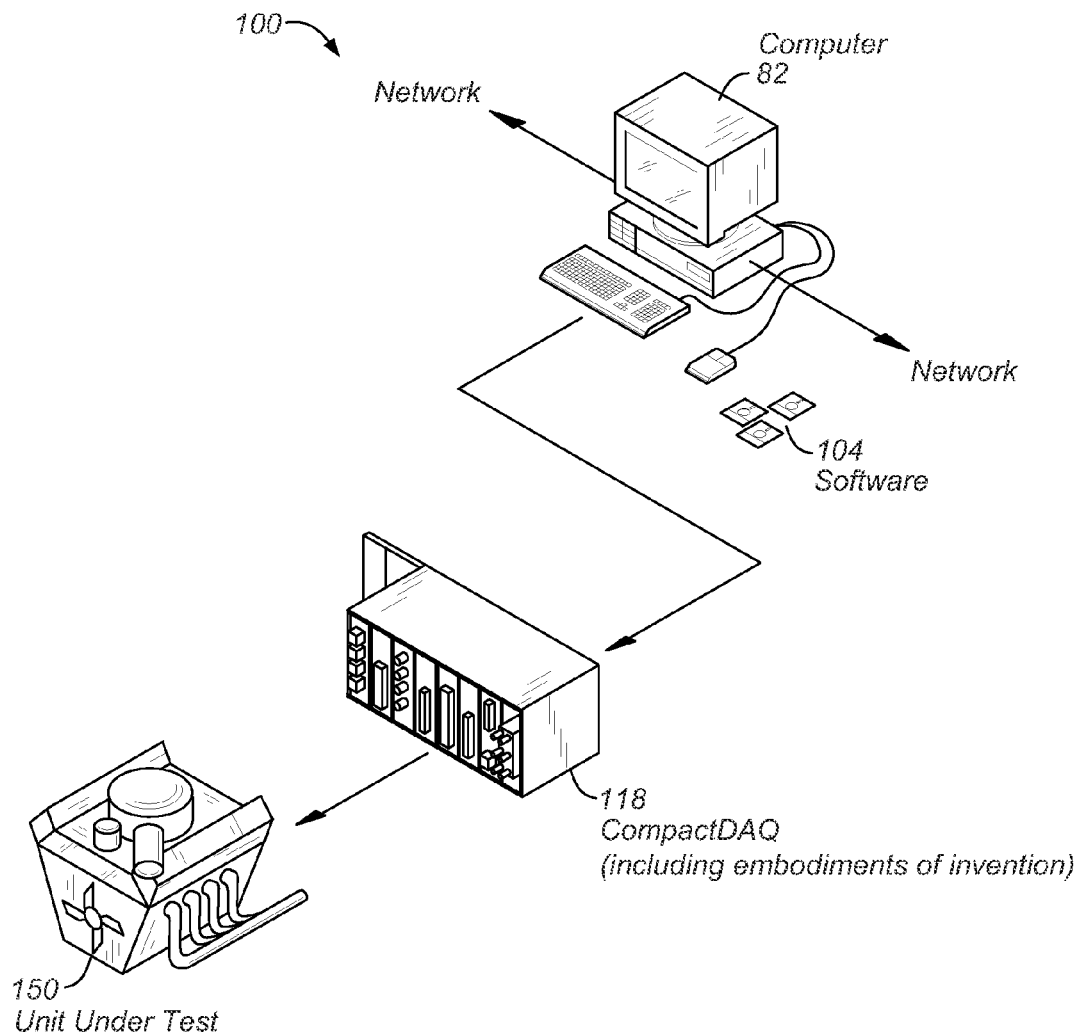
FIG. 1 illustrates a system for measuring current according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Terms

The following is a glossary of terms used in the present application:

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism", where the tasks are performed in an interleaved manner, e.g., by time multiplexing of execution threads.

Approximately—refers to a value that is almost correct or exact. For example, approximately may refer to a value that is within 1 to 10 percent of the exact (or desired) value. Thus, a fault current may have a value of approximately 1250 amperes for approximately one cycle. In such an instance, the actual value of the fault current may be in the range of 1125 to 1237 amperes and would be considered approximately 1250 amperes. Similarly, approximately one cycle at 50 Hz (e.g., one cycle every 0.0200 seconds) may have an actual value in the range of 50.5 (one cycle every 0.0198 seconds) to 55.6 (one cycle every 0.0180 seconds) Hz and would be considered approximately 50 Hz. It should be noted, however, that the actual threshold value (or tolerance) may be application dependent. For example, in one embodiment, "approximately" may mean within 0.1% of some specified or desired value, while in various other embodiments, the threshold may be, for example, 2%, 3%, 5%, and so forth, as desired or as required by the particular application.

Primary Coil—refers to a coil to which an input voltage is applied in an inductively coupled circuit, such as a circuit including a current transformer. In other words, the primary coil refers to the coil forming the part of an electrical circuit such that changing current in it induces a current in a neighboring circuit, i.e., current through a primary coil induces current in a secondary coil. Additionally, it should be noted that the current passing through the primary coil may generally be greater than the current induced in the secondary coil.

Secondary Coil—refers to a coil in which current is induced in it by passing a current through another coil, i.e., the primary coil.

FIG. 1: Exemplary System for Measuring Current

FIG. 1 illustrates an exemplary system for measuring current according to one embodiment of the invention. As shown, system 100 may include a computer 82 coupled to a network. Computer 82 may include a CPU, a display screen, memory, and one or more input devices such as a mouse or keyboard as shown. The computer 82 may operate with one or more instruments, such as CompactDAQ 118 provided by National Instruments Corporation, to analyze, measure, or control a unit under test (UUT) or process 150, e.g., via execution of software 104.

As depicted, the instrument, e.g., CompactDAQ 118, may include modules that may include embodiments of the present invention to connect to UUT 150 and measure current from a current source included in UUT 150. Note, however, that CompactDAQ 118 is only an exemplary example of a chassis that may include or implement embodiments of the invention. It is envisioned that embodiments of the invention may be included or implemented in any of a variety of chassis, such as National Instruments Corporation's PXI chassis and CompactRIO, among others. Note further, that system 100 is exemplary only, and embodiments of the present invention may be used in a data acquisition and control application, in a test and measurement application, an image processing or machine vision application, a process control application, a man-machine interface application, a simulation application, or a hardware-in-the-loop validation application, among others.

Figure 2:
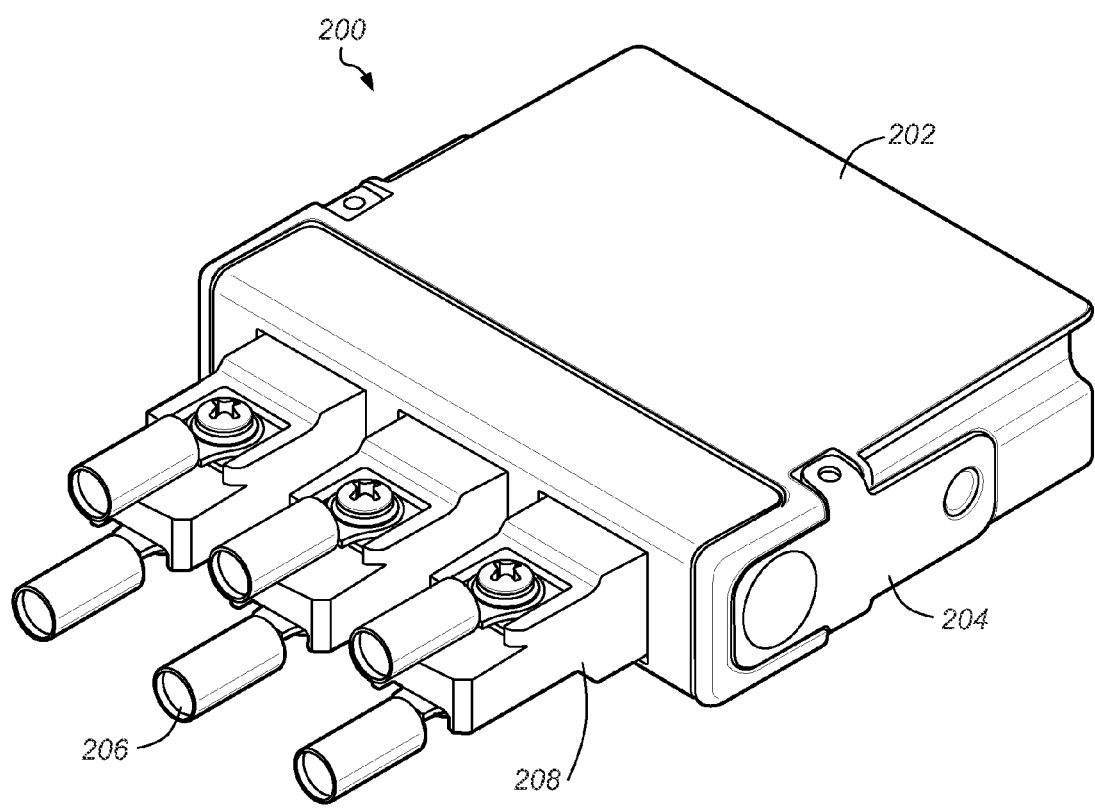
FIG. 2 illustrates an exemplary module that includes one embodiment of the invention.

FIG. 2: Exemplary Module for Measuring Current

FIG. 2 illustrates an exemplary module for measuring current according to one embodiment of the invention. As shown, module 200 may be included in a system, such as system 100. Module 200 may include a housing 202 and securing tabs 204 for securing module 200 in a chassis, such as CompactDAQ 118, although any other type of instrument or chassis may be used as desired. The housing 202 may house a printed circuit board (PCB). The PCB may include circuitry for measuring current. Additionally, one or more current measurement connectors 208 may be coupled to the PCB enclosed within housing 202. In certain embodiments, current measurement connectors 208 may include a primary and a secondary coil. In such embodiments, the primary coil may be electrically isolated from the PCB. In other words, the secondary coil of the current measurement connectors 208 may be electrically coupled the PCB and the primary coil of the current measurement connectors 208 may be mechanically coupled to the PCB. Additionally, current measurement connectors 208 may be thermally insulated from the PCB and housing 202. Hence, the PCB and housing 202 may be electrically isolated and thermally insulated from a fault current passed through the primary coil of one or more of the current measurement connectors 208. The fault current may be generated by one or more current sources coupled to the one or more current measurement connectors 208 via mounting for wire lugs 206 that may be mounted to current measurement connectors 208. The wire lugs 206 may be electrically coupled to the one or more current measurement connectors 208 via threaded fasters. Further details regarding current measurement connectors 208 are provided below.

FIGS. 3-6: Exemplary Embodiment of a Low Profile Current Measurement Connector

FIGS. 3-6 illustrate an exemplary embodiment of a low profile current measurement connector. The current measurement connector may include at least two parts mechanically coupled to form a primary coil through a current transformer. Once coupled, or joined, the at least two parts may be electrically coupled such that a first current may be passed through the primary coil formed by the at least two parts to induce a second current in the current transformer. In other words, during operation, the at least two parts may form or implement a primary coil, where a current passing through the primary coil may induce current in a secondary coil, e.g., the coil of the current transformer. The current induced in the current transformer may be usable to measure the current passing through the primary coil.

Figure 3A:
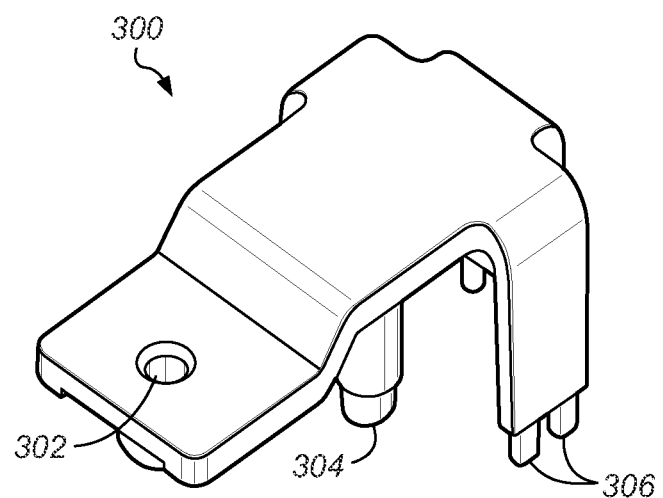
FIG. 3A illustrates a first part of a low profile current measurement connector according to an embodiment of the invention.

As illustrated in FIG. 3A, a first part 300 of a current measurement connector, such as the one or more current measurement connectors 208, may include a mount and a joint. The mount may be similar to exemplary mount 302. In one embodiment, mount 302 may be configured to couple to a wire lug, such as one of wire lugs 206 of FIG. 2. In other embodiments, mount 302 may include a screw terminal or wire clamp, among other types of mounts suitable for electrically coupling a current source to the first part 300. Additionally, first part 300 may include a joint 304. The joint may be any of various types including a cold-forming, or press-fitting joint, a threaded joint, a welding joint, an adhesive joint, or any other type of joint suitable for mechanically and electrically coupling the first part 300 to a second part of the current measurement connector (discussed below with respect to FIG. 3B) to implement the techniques disclosed herein. In other words, the joint may be required to electrically couple first part 300 to a second part of the current measurement connector, such as second part 350 discussed below with respect to FIG. 3B.

In certain embodiments, first part 300 may also include mounting tabs 306 suitable for mechanically coupling first part 300 to a PCB. In one embodiment, mounting tabs 306 may be one or more soldering pins. In certain embodiments, the soldering pins may be configured to mount to a PCB via a wave soldering process. In such embodiments, the first part 300 may mount to the PCB via through holes disposed in the PCB. As illustrated, first part 300 may include one or more sets of mounting tabs 306. Thus, the first part 300 may be mechanically coupled to the PCB and may not be electrically coupled to the PCB. Of course, any other mechanical coupling means may be used as desired.

Figure 3B:
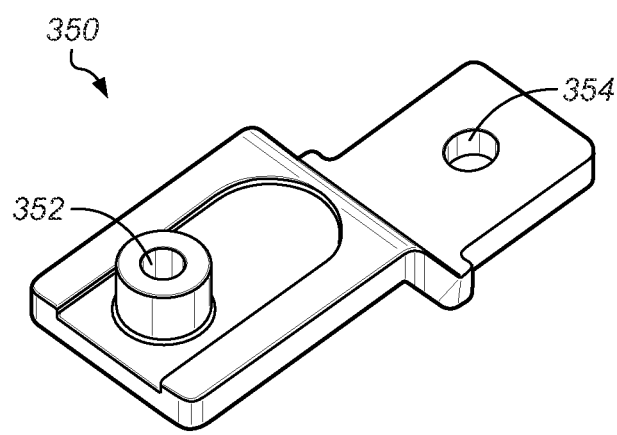
FIG. 3B illustrates a second part of a low profile current measurement connector according to an embodiment of the invention.

As illustrated in FIG. 3B, a second part 350 of a current measurement connector may include a mount and a joint. The mount may be similar to mount 352 and configured to couple to a wire lug, such as wire lugs 206 of FIG. 2. In some embodiments, mount 352 may include a screw terminal or wire clamp, among other types of mounts suitable for electrically coupling a current source to the second part 350. Additionally, second part 350 may include a joint 354. The joint may be any of various types including a cold-forming, or press-fitting joint, a threaded joint, a welding joint, an adhesive joint, or any other type of joint suitable for mechanically and electrically coupling the second part 350 to a first part of the current measurement connector (discussed above with respect to FIG. 3A) to implement the techniques disclosed herein. In other words, the joint may be required to electrically couple second part 350 to a first part of the current measurement connector, such as first part 300 discussed above with respect to FIG. 3A.

In some embodiments the first and second parts may be die cast. The die cast material used to cast the first and second part may be one of zinc, aluminum, or copper, among other die casting materials. In other embodiments, the die cast material may be an alloy that may include one or more of zinc, aluminum, or copper. In one particular embodiment, zinc die cast ZA-8 may be used. In another embodiment, the die cast material may be specified such that the die cast may be molded in thin walls, e.g., a nominal wall thickness of approximately 0.06 to 0.09 inches. In other words, the wall thickness may be sufficiently thin to allow the die cast part to be solderable. Additionally, the die cast material may have a relatively low electrical resistivity, e.g., approximately 50 to 70 nano-ohm meters, in order to prevent the parts from generating excessive heat due to an applied current. In other words, the electrical resistivity of the parts may be sufficiently low to allow higher currents to be applied to the parts without the generation of excessive heat. In certain embodiments, the die cast material may have the capability to be tin plated, which may prevent galvanic corrosion of the first and second mounts Also, in some embodiments, the die cast material may have the capability to be cold-worked. In other words, the material may have the capability to be strengthened via plastic deformation. Examples of cold-working, or work-hardening processes, include, among others, press-fitting, rolling, extruding, forging, riveting, and burnishing.

Figure 4:
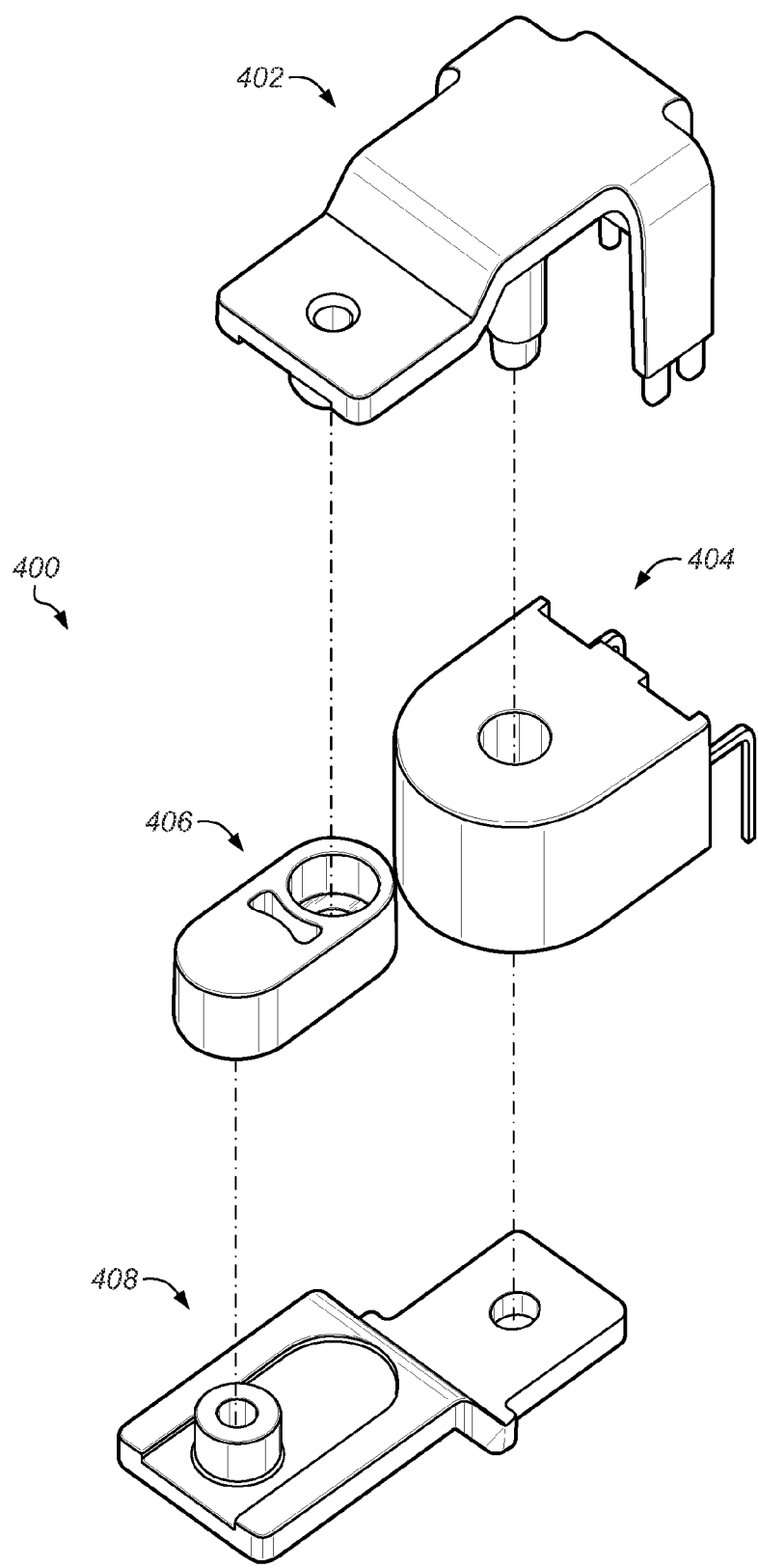
FIG. 4 illustrates an exploded view of a low profile current measurement connector according to an embodiment of the invention.

FIG. 4 illustrates an exploded view of an exemplary low profile current measurement connector according to an embodiment of the invention. As shown, current measurement connector 400 may include a first part 402, a second part 408, a current transformer 404, and a spacer 406. The first part 402 may be similar to first part 300 described above in reference to FIG. 3A. Similarly, second part 408 may be similar to second part 350 described in reference to FIG. 3B. As illustrated in FIG. 4, first part 402 and second part 408 may be configured to join through current transformer 404. In other words, the current transformer 404 may be interposed between the first part 402 and the second part 408. The joining of first part 402 and second part 408 may form a primary coil that passes through current transformer 404. Additionally, first part 402 and second part 408 may be joined via any of a variety of mechanical or chemical processes, including, among others, welding, riveting, threaded fasteners, soldering, adhesion, and cold-forming, or press-fitting, among others. In one particular embodiment, the first part 402 and second part 408 are joined through the current transformer 404 via a press fit. In other words, the joint may be formed in a cold forming process in which the two parts are pressed together in a cold forming, cold working, or work hardening process. In such embodiments, the joint formed may have a low resistance, e.g., approximately 100 to 200 micro-ohms. In other words, the joint formed may have a sufficiently low resistance to allow higher currents to be applied through the joint without the generation of excessive heat.

In certain embodiments, the spacer 406 may be interposed between a first mount of the first part 402 and a second mount of the second part 408. In such embodiments, the spacer may be configured to isolate the first mount and the second mount from mechanical vibrations. Additionally, in an exemplary embodiment, the spacer may be configured to prevent an alternative electrical coupling between the first mount and the second mount. In other words, the spacer may prevent the accidental shorting of the first mount to the second mount upon connection to a current source. For example, in a particular embodiment, the spacer may prevent a screw used to connect the current source to the first part of the current measurement connector from bottoming out against the second part of the current measurement connector. In other words, the screw would bottom out against the non-conductive spacer and thus prevent the screw from shorting the first part to the second part. Additionally, in certain embodiments the spacer may stabilize the parts of the current measurement connector by preventing the parts from rotating or twisting relative to one another. Further, in one particular embodiment, the spacer may prevent the overmold (discussed below in reference to FIG. 6) from leaking or encapsulating threads that may be provided for connecting the current source to current measurement device.

Figure 5:
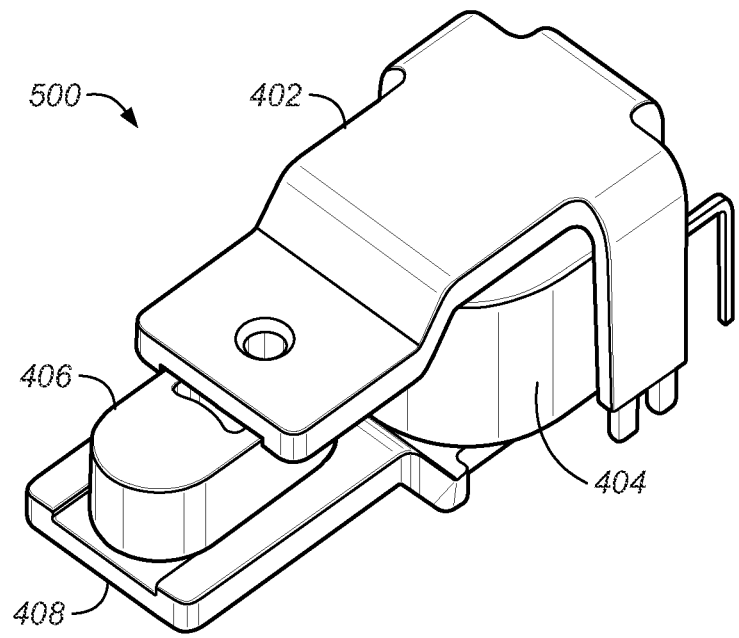
FIG. 5 illustrates an assembled view of a low profile current measurement connector according to one embodiment of the invention.

FIG. 5 illustrates an assembled view of an exemplary low profile current measurement connector 500 according to an embodiment of the invention. As illustrated, current measurement connector 500 is an assembled embodiment of current connector 400 of FIG. 4, and so like or corresponding parts are numbered accordingly. As shown, current connector 500 may include first part 402, current transformer 404, spacer 406, and second part 408. First part 402 may be joined to second part 408, thereby forming a primary coil through current transformer 404. Thus, a current passed through the primary coil may induce a current in the current transformer which may be usable to measure the current passed through the primary coil. It should be noted that the current passing through the primary coil may generally be greater than the current induced in the secondary coil. First part 402 may include one or more soldering pins configured to mechanically couple to a PCB. Further, current transformer 404 may include one or more soldering pins (or other coupling means) configured to electrically couple to the PCB. Thus, the primary coil, e.g., the coil formed by joining the first part 402 and the second part 408 may not be electrically coupled to the PCB.

Figure 6:
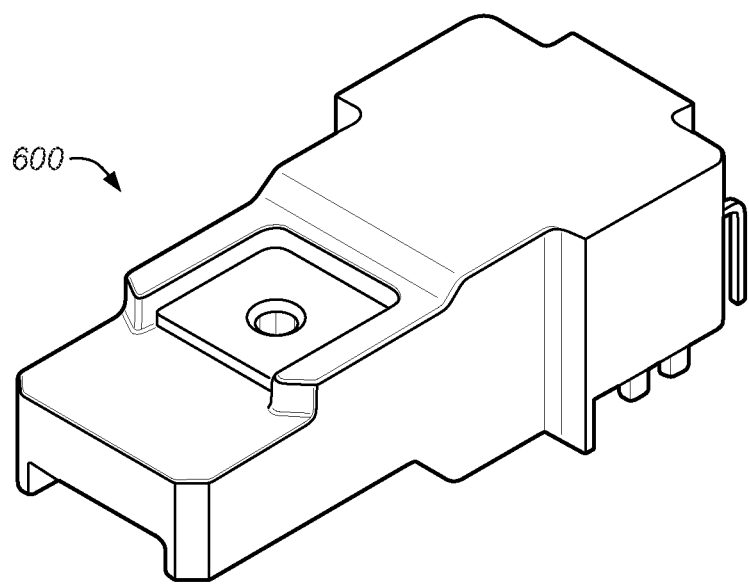
FIG. 6 illustrates an assembled view including an overmold of a low profile current measurement connector according to an embodiment of the invention.

FIG. 6 illustrates an assembled view of an exemplary low profile current measurement connector 600 according to an embodiment of the invention. As illustrated, current measurement connector 600 may be similar to current connector 500 of FIG. 5, and may further include an overmold. In other words, current measurement connector 600 illustrates an embodiment of current connector 500 with an overmold. The overmold may encapsulate the first and second parts of current measurement connector. Additionally, the overmold may electrically isolate the current measurement connector 600. Further, in some embodiments, the overmold may thermally insulate the current measurement connector. Also, the overmold may mechanically isolate the current measurement connector from mechanical vibration. In one embodiment, the overmold may be a high temperature liquid crystal polymer plastic.

In certain embodiments, the current measurement connector may be able to withstand over current, or fault current, pulses or events. Withstanding such events, or pulses, may protect the current transformer that may be included in the current measurement connector. Additionally, the current measurement connector may be able to dissipate heat associated with such fault current pulses further protecting the current transformer from damage. Note further, that such heat dissipation may also protect the heat sensitive components included on a PCB that may be coupled to the current measurement connector. In other words, the current measurement connector may protect the components included in a module such as module 200 described above. Thus, in one embodiment, the current measurement connector may be able to withstand over current, or fault current, pulses or events of at least approximately one thousand two hundred and fifty amperes for at least one cycle. Note that these fault current values, e.g., pulse or events, are exemplary only. In other embodiments, withstanding other fault current values, e.g., pulses or events, may be necessary, depending on the application and/or system requirements.

As used herein, the term "approximately" generally refers to a value that is almost correct or exact. For example, approximately may refer to a value that is within 1 to 10 percent of the exact (or desired) value. Thus, a fault current may have a value of approximately 1250 amperes for approximately one cycle. In such an instance, the actual value of the fault current may be in the range of 1125 to 1237 amperes and would be considered approximately 1250 amperes. Similarly, approximately one cycle at 50 Hz (e.g., one cycle every 0.0200 seconds) may have an actual value in the range of 50.5 (one cycle every 0.0198 seconds) to 55.6 (one cycle every 0.0180 seconds) Hz and would be considered approximately 50 Hz. However, as noted above, the actual threshold value (or tolerance) may be application dependent. For example, in one embodiment, "approximately" may mean within 0.1% of some specified or desired value, while in various other embodiments, the threshold may be, for example, 2%, 3%, 5%, and so forth, as desired or as required by the particular application.

Figure 7:
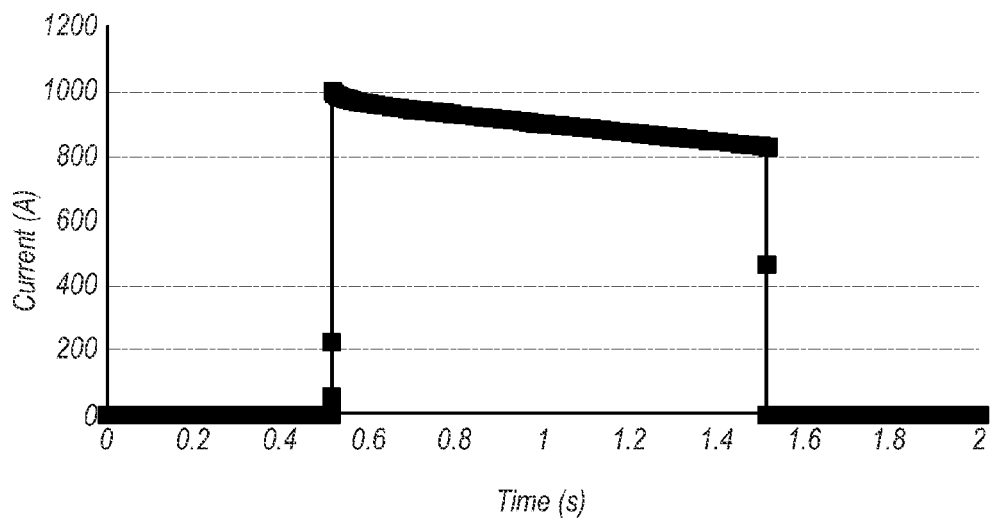
FIG. 7 illustrates an exemplary result of a current measurement of a fault current event applied to an embodiment of the invention.
Figure 8:
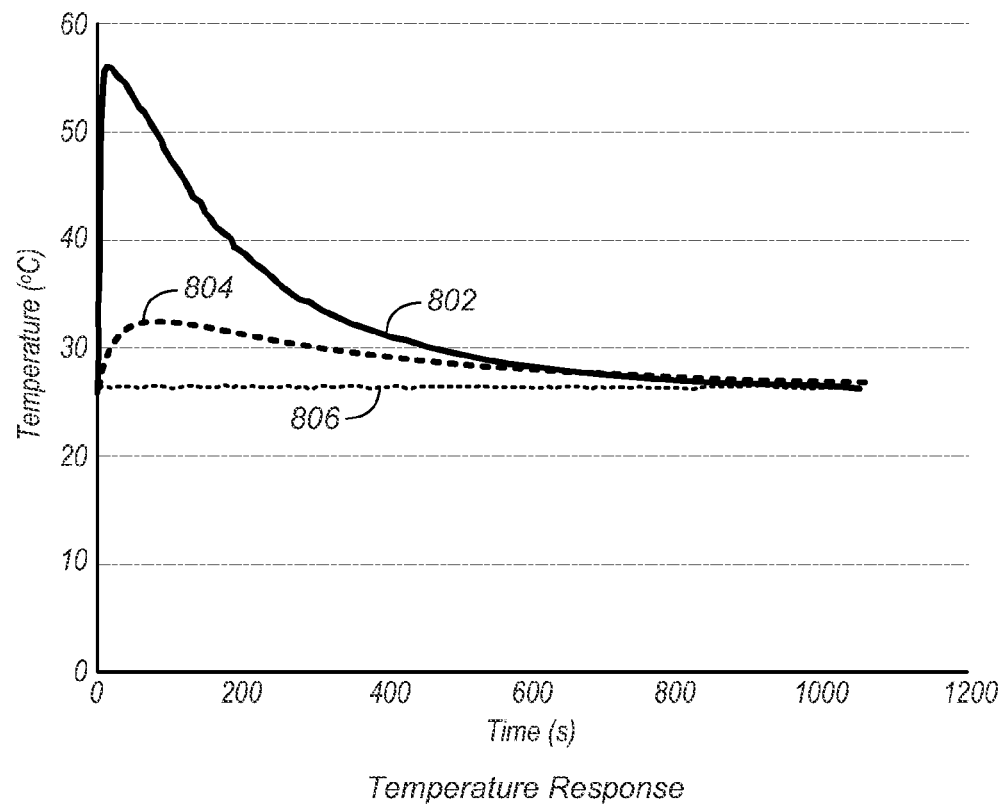
FIG. 8 illustrates an exemplary result of temperature increase due to a fault current event applied to an embodiment of the invention.

FIGS. 7-8 below provide exemplary results of the thermal response of an exemplary current measurement connector that includes embodiments of the present invention.

FIGS. 7-8: Exemplary Results of a Fault Current Event

FIGS. 7 and 8 illustrate exemplary results of a thermal test of a fault current event as measured on an exemplary embodiment of the invention. As illustrated in FIG. 7, a fault current may be applied to an exemplary current measurement connector configured with embodiments of the present invention. The fault current event, or over current event, may have an average value of approximately 1,000 amperes over a duration of approximately one second. The drop in the current over the one second event is a result of the resistance of the exemplary current measurement connector increasing as the temperature of the current measurement connector increases.

FIG. 8 illustrates a temperature response of the exemplary current measurement connector in response to a current pulse. The temperature 802 represents the temperature of the joined first and second parts of the exemplary current measurement connector. Temperature 804 represents the internal ambient temperature of the housing that may enclose a PCB that the exemplary current measurement connector may be coupled to. Temperature 806 represents the external ambient temperature, e.g., the room temperature. In this particular case, the current pulse was applied within the first two seconds of the temperature response measurement. As may be seen, temperature 802 reached a maximum temperature of approximately 56° C., while temperature 804 reached a maximum temperature of approximately 32° C. The low temperature rise is a direct result of the low resistance joint and overall low resistivity of the exemplary current measurement connector, and thus illustrates a benefit of the present techniques.

Figure 9:
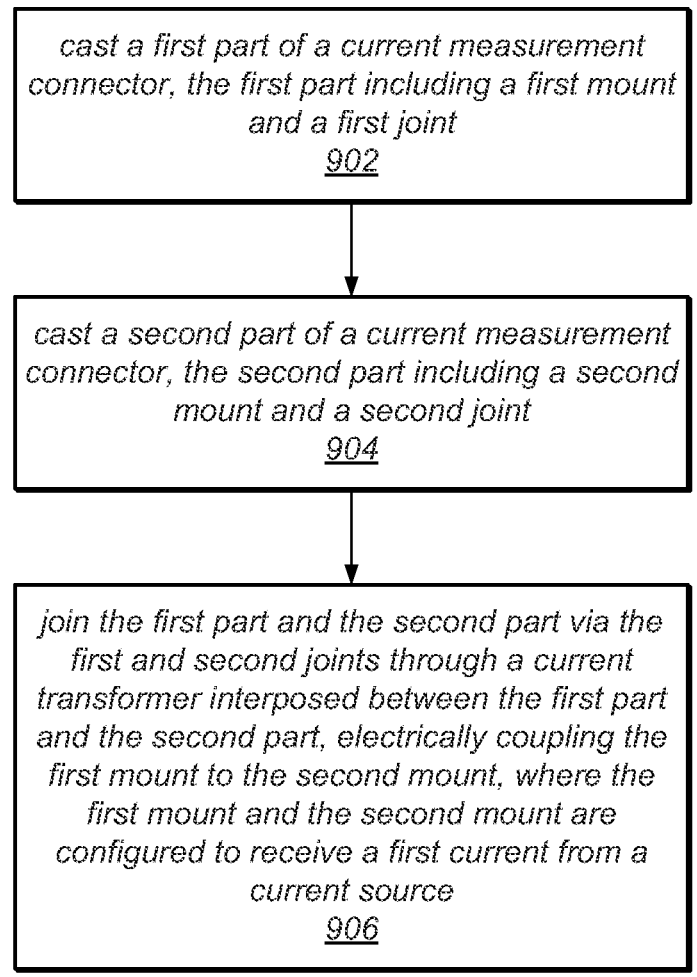
FIG. 9 is a block diagram of a method of fabricating a low profile current measurement connector according to an embodiment of the invention.

FIG. 9: Block Diagram of a Method for Fabricating a Low Profile Current Measurement Connector FIG. 9 illustrates a method for manufacturing, or fabricating, a low profile current measurement connector according to one embodiment. The method of FIG. 9 may be used to fabricate any of the embodiments of the current measurement connectors described in reference to the above Figures. In various embodiments, some of the method elements shown may be performed concurrently, in a different order than shown, or may be omitted. Additional method elements may also be performed as desired. As shown, this method may operate as follows.

In 902, a first part of the current measurement connector may be cast. The first part may include a first mount and a first joint, such as a cold-forming joint. Alternatively, the first part may be manufactured, or fabricated, using any of various techniques, such as die casting, machining, or stamping, among others. In some exemplary embodiments, the first part may be die cast from one or more of: zinc, aluminum, or copper, i.e., the die cast material may be any of these metals, or may be an alloy that includes one or more of these metals. As noted above, in one particular embodiment, zinc die cast ZA-8 (an alloy of zinc) may be used. In certain embodiments, the first part may also include one or more pins or tabs for connecting the current measurement connector to a PCB. In one exemplary embodiment, the first part may include soldering pins configured to mount to the PCB via holes disposed in the PCB. In such embodiments, the current measurement connector may be coupled, or attached, to the PCB via a wave soldering process. Note, however, that the first part may not be electrically coupled to the PCB. In other words, the coupling between the PCB and the first part may be mechanical only. Accordingly, the first part may be electrically isolated (or insulated) from the PCB.

In 904, a second part of the current measurement connector may be cast. The second part may include a second mount and a second joint, such as a cold-forming joint. Alternatively, the second part may be manufactured, or fabricated, using any of various techniques, such as die casting, machining, or stamping, among others. In some exemplary embodiments, the second part may be die cast from one or more of: zinc, aluminum, or copper, or an alloy that includes one or more of these metals, e.g., zinc die cast ZA-8 (an alloy of zinc).

In 906, the first and second parts may be joined through a current transformer interposed between the first and second parts via the first and second joints. Joining the first and second parts may electrically couple the first mount to the second mount. Additionally, the first and second mount may be configured to receive current from a current source. Further, the current measurement connector may be configured to pass the current from the current source through the first and second joints and induce current in the current transformer useable to measure the current received from the current source.

In some embodiments, the first and second joints may be cold-forming joints. In such embodiments, joining the first and second parts may also include press fitting the first part and the second part together via the first and second cold-forming joints. Alternatively, the first and second parts may be joined using any of various manufacturing techniques such as welding or braising, among others. For example, in some embodiments, the first and second parts may be joined using a threaded fastener or adhesive, among others techniques for fastening. In some embodiments, the technique used for joining may be particularly chosen to produce low resistivity in the joint.

In some embodiments, the method may further include applying an overmold to the current measurement connector after the first and second parts have been joined through the current transformer. The overmold may encapsulate the first and second parts connected through the current transformer. Additionally, the overmold may electrically isolate the current measurement connector and thermally insulate the current measurement connector. Further, the overmold may mechanically isolate the current measurement connector from mechanical vibration. In some embodiments, the overmold may be a high temperature liquid crystal polymer plastic.

In an exemplary embodiment, joining the first part and the second part may also include interposing a spacer between the first and second mount. In an exemplary embodiment the spacer may be configured to isolate the first mount and second mount from mechanical vibration. Additionally, the spacer may be configured to prevent an alternative electrical coupling (electrical short) between the first mount and second mount.

In one embodiment, the method may also include plating the first and second parts, e.g., the first and second parts may be plated with tin, which may prevent galvanic corrosion of the first and second mounts. Other plating materials may be used as desired.

Figure 10:
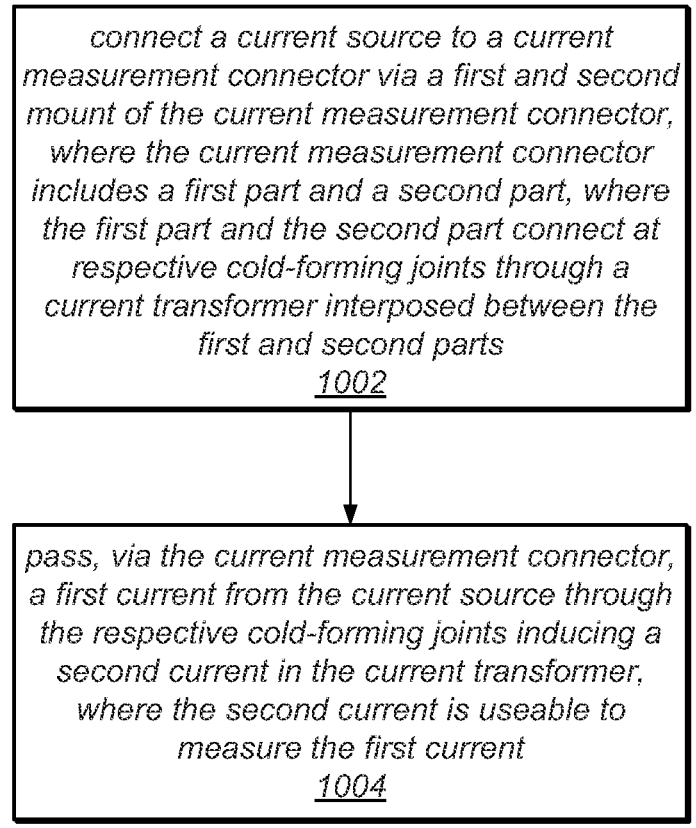
FIG. 10 is a block diagram of a method of using a low profile current measurement connector according to an embodiment of the invention.

FIG. 10: Block Diagram of a Method for Measuring Current Using a Low Profile Current Measurement Connector FIG. 10 illustrates a method for measuring current using a low profile current measurement connector, according to one embodiment. The method of FIG. 10 may be used with any of the embodiments of the current measurement connectors described in reference to the above Figures. In various embodiments, some of the method elements shown may be performed concurrently, in a different order than shown, or may be omitted. Additional method elements may also be performed as desired. As shown, this method may operate as follows.

In 1002, a current source may be connected to a current measurement connector via a first and second mount of the current measurement connector. The current measurement connector may include a first part and a second part. The first part and the second part may connect at respective cold-forming joints through a current transformer interposed between the first and second parts. In certain embodiments, the current measurement connector may be similar to the current measurement connectors described above.

In 1004, a current from the current source, e.g., a first current, may be passed through the current measurement connector. The current from the current source may induce a current in the current transformer, e.g., a second current. The current in the current transformer may be useable to measure the current from the current source.

In certain embodiments, the method may also include applying a fault current pulse to the current measurement connector. In some embodiments, the fault current pulse, or over current event, may be at least approximately one thousand two hundred and fifty amperes for at least approximately one cycle, although other pulse amplitudes and/or durations may be used as desired. Note that these fault current values, e.g., pulse or events, are exemplary only. In other embodiments, withstanding other fault current values, e.g., pulses or events, may be necessary, depending on the application and/or system requirements. Additionally, note that a cycle may refer to a complete period within an alternating current (AC) waveform. Thus, the cycle may last for at least approximately 0.02 seconds for a 50 Hz AC waveform.

Additionally, the method may include dissipating, via the first and second parts of the current measurement connector, heat associated with the application of the fault current pulse. Dissipating the heat associated with the fault current pulse may protect the current transformer. Additionally, dissipation of the heat associated with the fault current pulse may protect sensitive components included in a housing of a PCB that the current measurement connector may be coupled to.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A current measurement connector, comprising:
    a first part, wherein the first part comprises:
    a first mount; and
    a first joint;
    a second part, wherein the second part is physically separate and distinct from the first part, and wherein the second part comprises:
    a second mount; and
    a second joint; and
    a current transformer, interposed between the first part and the second part;
    wherein the first part and the second part physically connect together at and via the first and second joints and extend through the current transformer, thereby electrically coupling the first mount to the second mount so as to allow the first mount and the second mount to conductively receive a first current from a current source; and wherein the current measurement connector is configured to pass the first current from the current source through the first and second joints thereby inducing a second current in the current transformer, wherein the second current is useable to measure the first current.

2. The current measurement connector of claim 1, wherein the first joint is a first cold-forming joint, wherein the second joint is a second cold-forming joint, and wherein the first part and the second part connect at the first and second cold-forming joints via a press fit.

3. The current measurement connector of claim 1, wherein the first part further comprises:
one or more soldering pins, wherein the one or more soldering pins are configured to mount via a wave soldering process to a printed circuit board via through holes disposed in the printed circuit board.

4. The current measurement connector of claim 3, wherein the first part is not electrically coupled to the printed circuit board.

5. The current measurement connector of claim 1, wherein the first part and the second part are die cast from one or more of zinc, aluminum, or copper.

6. The current measurement connector of claim 1, further comprising:
an overmold, wherein the overmold:
encapsulates the first and second parts connected through the current transformer;
electrically isolates the current measurement connector;
thermally insulates the current measurement connector; and
mechanically isolates the current measurement connector from mechanical vibration.

7. The current measurement connector of claim 1, wherein the current measurement connector is able to withstand fault current pulses of at least approximately one thousand two hundred and fifty amperes for at least approximately one cycle, thereby protecting the current transformer from damage.

8. The current measurement connector of claim 1, wherein the current measurement connector is able to dissipate heat associated with fault current pulses of at least approximately one thousand two hundred and fifty amperes for at least approximately one cycle, thereby protecting the current transformer from damage.

9. The current measurement connector of claim 1, further comprising:
a spacer, interposed between the first mount and the second mount, wherein the spacer is configured to:
isolate the first mount and second mount from mechanical vibration; and
prevent an alternative electrical coupling between the first mount and second mount.

10. The current measurement connector of claim 1, wherein, when connected, the first and second joints implement at least a portion of a primary coil.

11. The current measurement connector of claim 1, wherein the first mount is further configured to electrically couple to a first wire lug via a first threaded fastener, wherein the second mount is further configured to electrically couple to a second wire lug via a second threaded fastener, and wherein the first and second wire lug are electrically coupled to the current source.

12. A method for measuring current, the method comprising:
connecting a current source to a current measurement connector via a first and second mount of the current measurement connector, wherein the current measurement connector comprises a first part and a second part, wherein the second part is physically separate and distinct from the first part, and wherein the first part and the second part physically connect together at and via respective cold-forming joints and extend through a current transformer interposed between the first and second parts so as to allow the first mount and the second mount to conductively receive a first current from the current source; and
passing, via the current measurement connector, the first current from the current source through the respective cold-forming joints thereby inducing a second current in the current transformer, wherein the second current is useable to measure the first current.

13. The method of claim 12, further comprising:
applying a fault current pulse, wherein the fault current pulse is at least approximately one thousand two hundred and fifty amperes for at least approximately one cycle; and
dissipating, via the first and second parts, heat associated with said applying thereby withstanding said applying and protecting the current transformer.

14. The method of claim 12, wherein the first joint is a first cold-forming joint, wherein the second joint is a second cold-forming joint, and wherein the first part and the second part connect at the first and second cold-forming joints via a press fit.

15. The method of claim 12, wherein the first part further comprises:
one or more soldering pins, wherein the one or more soldering pins are configured to mount via a wave soldering process to a printed circuit board via through holes disposed in the printed circuit board.

16. The method of claim 15, wherein the first part is not electrically coupled to the printed circuit board.

17. The method of claim 12, wherein the first part and the second part are die cast from one or more of zinc, aluminum, or copper.

18. The method of claim 12, wherein the current measurement connector further comprises:
an overmold, wherein the overmold:
encapsulates the first and second parts connected through the current transformer;
electrically isolates the current measurement connector;
thermally insulates the current measurement connector; and
mechanically isolates the current measurement connector from mechanical vibration.

19. The method of claim 12, wherein the current measurement connector is able to withstand fault current pulses of at least approximately one thousand two hundred and fifty amperes for at least approximately one cycle, thereby protecting the current transformer from damage.

20. The method of claim 12, wherein the current measurement connector is able to dissipate heat associated with fault current pulses of at least approximately one thousand two hundred and fifty amperes for at least approximately one cycle, thereby protecting the current transformer from damage.

21. The method of claim 12, further comprising:
a spacer, interposed between the first mount and the second mount, wherein the spacer is configured to:
isolate the first mount and second mount from mechanical vibration; and
prevent an alternative electrical coupling between the first mount and second mount.

22. The method of claim 12, wherein, when connected, the first and second joints implement at least a portion of a primary coil.

23. The method of claim 12, wherein the first mount is further configured to electrically couple to a first wire lug via a first threaded fastener, wherein the second mount is further configured to electrically couple to a second wire lug via a second threaded fastener, and wherein the first and second wire lug are electrically coupled to the current source.

* * * * *